United States Patent [19]

Hankey

[11] 4,326,162
[45] Apr. 20, 1982

[54] CABLE TESTER WITH FIRST AND SECOND INTERENGAGING TEST MODULES

[76] Inventor: James H. Hankey, 1200 SW. 93 St., Miami, Fla. 33186

[21] Appl. No.: 146,081

[22] Filed: May 2, 1980

[51] Int. Cl.³ ............................................. G01R 31/02
[52] U.S. Cl. ...................................................... 324/51
[58] Field of Search .......................... 324/51, 66, 73 R

[56] References Cited

U.S. PATENT DOCUMENTS

| | | | |
|---|---|---|---|
| 2,814,774 | 11/1957 | Wong | 324/51 |
| 2,964,701 | 12/1960 | Argabright | 324/66 X |
| 3,217,244 | 11/1965 | Glover | 324/51 |
| 3,818,329 | 6/1974 | Reaves | 324/51 |
| 3,982,180 | 9/1976 | Vaiden | 324/66 X |
| 4,042,878 | 8/1977 | Peterson et al. | 324/51 |
| 4,074,187 | 2/1978 | Miller et al. | 324/66 X |

Primary Examiner—Gerard R. Strecker
Attorney, Agent, or Firm—John Cyril Malloy

[57] ABSTRACT

A cable tester composed of a first and second separate module each sized and configured with banks of male and female pins for nesting interengaged relationship and one of said modules including a battery and a switch in series with said battery and each of said modules including a circuit means including an LED, light emitting diode, in association with the pin of the bank of each module, so that the device may be used when connected to a cable, such as an IBM standard cable, for testing the same as is set forth more fully hereinafter.

4 Claims, 2 Drawing Figures

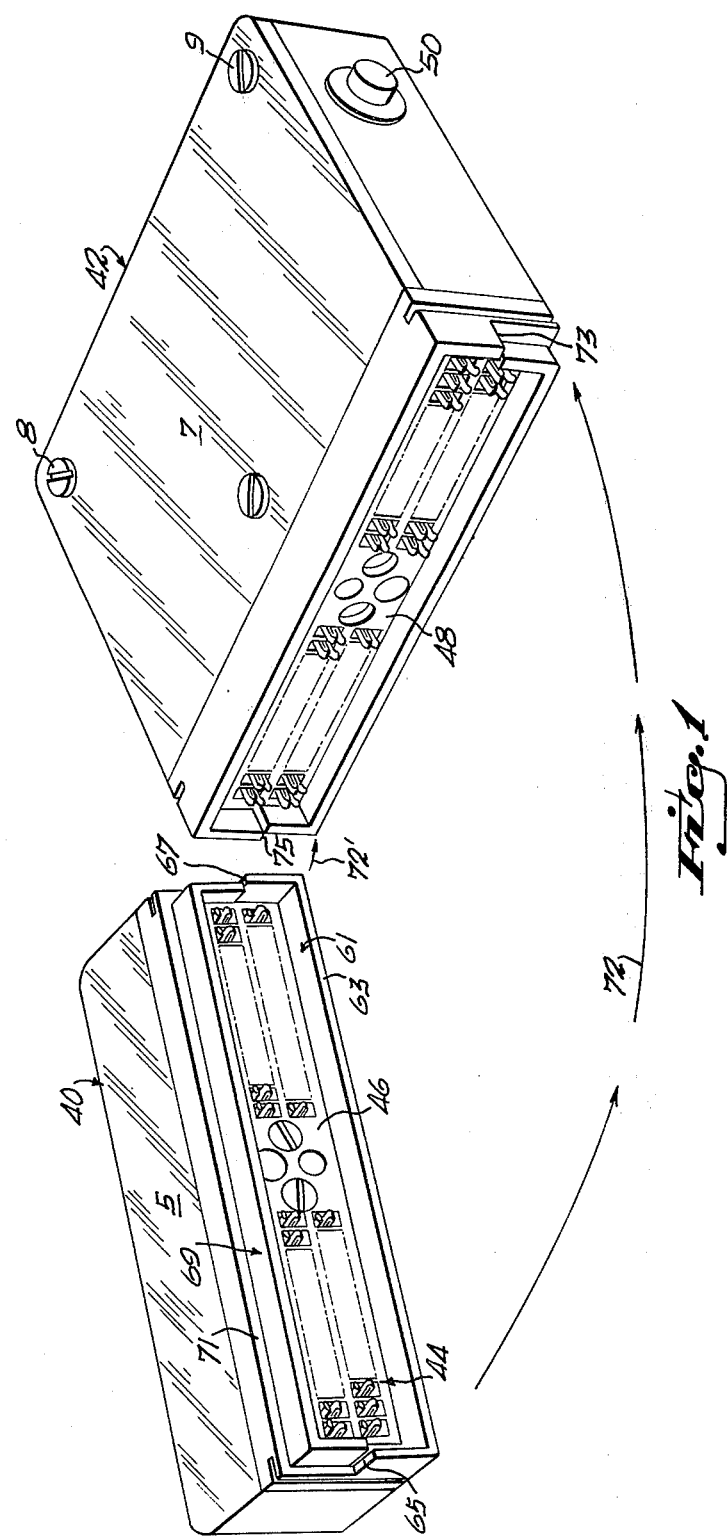

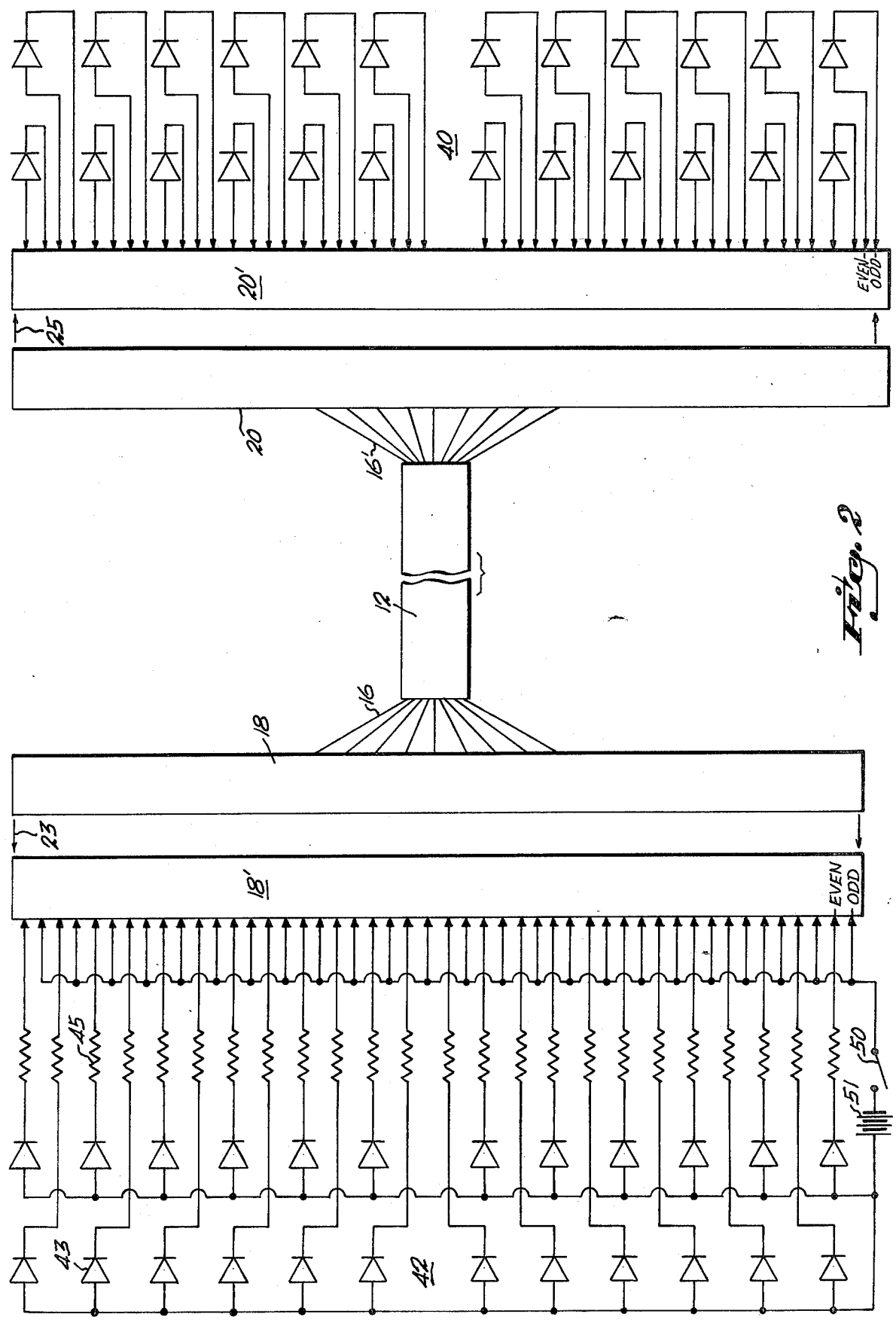

4,326,162

CABLE TESTER WITH FIRST AND SECOND INTERENGAGING TEST MODULES

FIELD OF THE INVENTION

This invention relates to a cable testing device.

OBJECTS OF THE INVENTION

This invention has as an object the provision of a cable tester which is compatible with hermaphroditic type cable heads, known in the trade as IBM standard, and which is useful in testing for opens, shorts, and pin reversals; the device is self-contained in that it is composed of pair of mating modules or housings, one of which includes a source, such as a 9 volt battery, and both of which include a bank of bright light emitting diodes, 24 in number in the preferred embodiment, and referred to hereinafter as "LED's" to signal the condition of the cable being tested and as is set out more fully hereinafter.

It is also an object of this invention to provide an improved device of the type described hereinafter which is simple and inexpensive to manufacture, highly useful, easily transportable and convenient to use in testing cables, such as standard IBM cables.

In accordance with these and other objects which will become apparent hereinafter, the instant invention will now be described with reference to the accompanying drawings in which:

DESCRIPTION OF THE DRAWINGS

FIG. 1 is a perspective view illustrating the instant invention; and

FIG. 2 is a schematic diagram illustrating the instant invention.

DESCRIPTION OF THE PREFERRED EMBODIMENT

Referring to the drawings wherein like reference characters designate like or corresponding parts throughout the several views and referring particularly to FIG. 2, there is represented a cable length 12 to be tested and through which there extend a plurality of separate conductors in parallel, such as that designated at one end by the numeral 16 and the other end by the numeral 16'. Connectors on each end of the cable, such as that indicated by the numerals 18 and 20 are provided, as is conventional, the exposed conductor lengths portions 16 and 16' being shown in FIG. 2 for convenience of description.

The instant invention is composed of a cable tester comprising two mating modules or housings which are designated by the numeral 40 and 42 respectively in FIG. 1. Each module may be regarded as including connectors as shown. Preferably the connector banks are provided, such as that designated by the numeral 44 with respect to the module 40; and each module has a main face generally designated by the numerals 46 and 48 respectively for confronting electrical interengagement with one another. The modules are companionately shaped for interengagement one with the other in nested and electrically interengaged relationship.

In use, the modules 40 and 42 are first interengaged with one another and the memory switch 50 of module 42 is depressed. Current first flows from the source 51 through the even pins of the modules 42 and 40 and then flows through the odd pins from module 40 to module 42 to complete the circuit. If there are any shorts in the modules on any particular circuit, that current will flow back through the circuit to a light emitting diode or sensing means such as that indicated by the numeral 43 and a resistor 45 to light the corresponding LED and therefore warn the operator that there is a short on that particular circuit. If no LED's light up, then the next step is performed.

The connector 20 of the cable 12 is connected to a connector 20' of module 40, while the other end of the cable, at the connector 18, is connected to a connector 18', as indicated by the arrowed lines 23 and 25. The memory switch 50 is then depressed on the test module 42. In this mode the current flows out of all the even pins of the cable. If both ends of the cable are pinned correctly into the connectors, the current will flow through the diodes and test module 42 and return on all the odd pins back to test module 40, then flow through the circuit and light up all of the corresponding LED's. Thus, in this test mode, a user may verify one of three conditions: First, that all of the correct LED's light and the cable is good; Second, that one or more of the LED's do not light and there may be a miswire in the cable; and Third, one or more of the LED's do not light and there may be an open connection in the cable.

In the latter two conditions, the corresponding LED's will inform the operator as to where the problem is in the particular cable involved. The LED's are arranged in banks corresponding to the pins of the connectors and are visible through the top of the housing or modules. Preferably each module has a transparent top or window zone such as that designated by the numerals 5 and 7; and the top 7 of the module 42 is removably secured as by the screws 8 and 9 for access to and replacement of the battery 51, which is stored within that module.

Referring more particularly to FIG. 1, the faces 46 and 48 are mirror images of one another to accommodate the aforesaid interengagement of the modules. In the preferred embodiment and best mode, the main face of each module has a generally U-shaped portion. Reference will be made at this point to the module designated by the numeral 40, that is to the left of FIG. 1, where it is seen that the module has a generally U-shaped lower portion, upwardly opening, designated by the numeral 61 which extends a common distance from the main face to a terminal face 63 and defines a pair of upwardly facing shoulders and, additionally, are generally inverted U-shaped upper portion 69 which extends the same distance as the lower portion from the surface 71, the upper portion being somewhat foreshortened, as seen in elevation, to provide an abutment surface 71 when the pair of modules are mated as indicated by the arrowed lines 72 and 72' and the downwardly facing pair of shoulders 73 and 75 of module 42 are sliding engagement on the shoulders 62 and 67 of module 40.

While the instant invention has been shown and described herein in what is conceived to be the most practical and preferred embodiment, it is recognized that departures may be made therefrom within the scope of the invention, which is therefore not to be limited to the details disclosed herein but is to be accorded the full scope of the claims so as to embrace any and all equivalent apparatus and articles.

What is claimed is:

1. A cable tester device comprising:
   a first and second module, said modules each having a main face, each main face being companionately sized and configured for mating interengagement with each other in snug nested relation, each of said main faces having a bank of connector adapters composed of male and female pin means to connect one of the modules to each end of a cable provided with a companionate connector, said banks of pin means being composed of mating pins electrically in engagement with one another when said modules are interengaged in nesting relation with one another, a circuit means in said first module including a conductor electrically connected to each pin and electrically in series with a separate light emitting diode and resistor in series with one another, all of said conductors including said light emitting diodes and resistors in series therewith being in parallel with one another and in series with a main conductor circuit, said main conductor circuit including a battery in series with said parallel conductors to simultaneously energize the same and switch means for controlling energy flow from said battery through said circuit means of said first module;

the pin means of said second module being arranged in an array corresponding to the pins of said first module and said pin means of said array of said second module being in a pattern of odd and even pin means with an odd pin means between each even pin means, and a circuit in said second module connecting each adjacent odd and even pin through a light emitting diode in series therewith and comprising 24 separate circuits.

2. The device as set forth in claim 1 wherein said main faces include an upwardly opening U-shaped portion and a foreshortened downwardly opening U-shaped portion and said U-shaped portions being adapted for interengaged nesting relation one with the other.

3. The device as set forth in claim 1 wherein said light emitting diodes of said modules are each arranged in an array corresponding to the location of the pin means and said module includes window means through the light emitting diodes may be observed.

4. The device as set forth in claim 1 wherein said device includes 24 separate diodes in each module.

* * * * *